(12) United States Patent
Lanzillo et al.

(10) Patent No.: US 12,334,442 B2
(45) Date of Patent: Jun. 17, 2025

(54) DIELECTRIC CAPS FOR POWER AND SIGNAL LINE ROUTING

(71) Applicant: International Business Machines Corporation, Armonk, NY (US)

(72) Inventors: Nicholas Anthony Lanzillo, Wynantskill, NY (US); Ruilong Xie, Niskayuna, NY (US); Lawrence A. Clevenger, Saratoga Springs, NY (US); Hosadurga Shobha, Niskayuna, NY (US); Huai Huang, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 485 days.

(21) Appl. No.: 17/899,740

(22) Filed: Aug. 31, 2022

(65) Prior Publication Data

US 2024/0071929 A1    Feb. 29, 2024

(51) Int. Cl.
*H01L 23/532* (2006.01)
*H01L 23/522* (2006.01)
*H01L 23/528* (2006.01)

(52) U.S. Cl.
CPC ...... *H01L 23/5329* (2013.01); *H01L 23/5226* (2013.01); *H01L 23/5286* (2013.01); *H01L 23/53228* (2013.01); *H01L 23/53242* (2013.01)

(58) Field of Classification Search
CPC ............ H01L 23/5329; H01L 23/5226; H01L 23/5286; H01L 23/53228; H01L 23/53242; H01L 21/76897; H01L 23/528; H01L 21/76885; H01L 21/76834
See application file for complete search history.

(56) References Cited

U.S. PATENT DOCUMENTS

| | | | |
|---|---|---|---|
| 8,122,412 B2 | 2/2012 | McElvain et al. | |
| 8,823,176 B2 | 9/2014 | Yang et al. | |
| 10,950,277 B1 | 3/2021 | Nobehara et al. | |
| 11,074,390 B2 | 7/2021 | Li et al. | |
| 2004/0173912 A1* | 9/2004 | Rhodes | H01L 21/76897 257/E21.507 |
| 2012/0256318 A1 | 10/2012 | Sawada | |
| 2013/0328210 A1 | 12/2013 | Shim | |
| 2017/0179154 A1* | 6/2017 | Furihata | H10D 89/911 |
| 2017/0278747 A1* | 9/2017 | Adusumilli | H01L 21/76897 |

(Continued)

FOREIGN PATENT DOCUMENTS

WO    2018/236354 A1    12/2018

OTHER PUBLICATIONS

D. Priyadarshini et al., "Advanced Metal and Dielectric Barrier Cap Films for Cu Low k Interconnects," IEEE International Interconnect Technology Conference, May 2014, pp. 185-188.

(Continued)

*Primary Examiner* — Patricia D Valenzuela
(74) *Attorney, Agent, or Firm* — Kimberly Zillig; Ryan, Mason & Lewis, LLP

(57) ABSTRACT

A semiconductor interconnect structure comprises a substrate, a plurality of metal lines disposed relative to the substrate and a plurality of first and second caps disposed on the metal lines wherein the first caps comprise a first dielectric material and the second caps comprise a second dielectric material different from the first dielectric material.

20 Claims, 14 Drawing Sheets

(56) References Cited

U.S. PATENT DOCUMENTS

2020/0343131 A1    10/2020   Choi et al.
2021/0082714 A1    3/2021   Xie et al.
2021/0090997 A1    3/2021   Haran et al.

OTHER PUBLICATIONS

N. A. Lanzillo et al., "Power Delivery Design, Signal Routing, and Performance of On-Chip Cobalt Interconnects in Advanced Technology Nodes," IEEE Transactions on Very Large Scale Integration (VLSI) Systems, Jan. 2022, pp. 60-67, vol. 30, No. 1.
M. O. Hossen et al., "Power Delivery Network (PDN) Modeling for Backside-PDN Configurations with Buried Power Rails and µ TSVs," IEEE Transactions on Electron Devices, Jan. 2020, pp. 11-17, vol. 67, No. 1.
Qualcomm Technologies, "Snapdragon 888 5G Mobile Platform," Accessed Aug. 30, 2022, 2 pages.
Wikipedia, "Apple A12," https://en.wikipedia.org/wiki/Apple_A12, Aug. 16, 2022, 4 pages.
R. Krashinsky et al., "NVIDIA Ampere Architecture In-Depth," https://developer.nvidia.com/blog/nvidia-ampere-architecture-in-depth/, May 14, 2020, 13 pages.
International Searching Authority, "Notification of Transmittal of the International Search Report and the Written Opinion of the International Searching Authority, or Declaration," Patent Cooperation Treaty, Nov. 6, 2023, 13 pages, International Application No. PCT/EP2023/071986.

\* cited by examiner

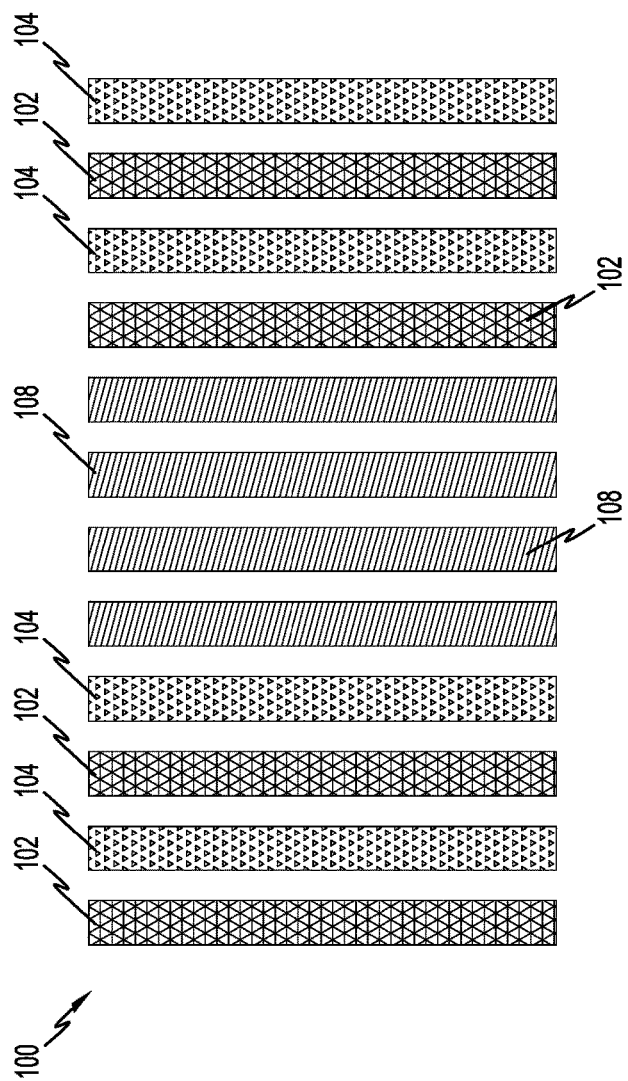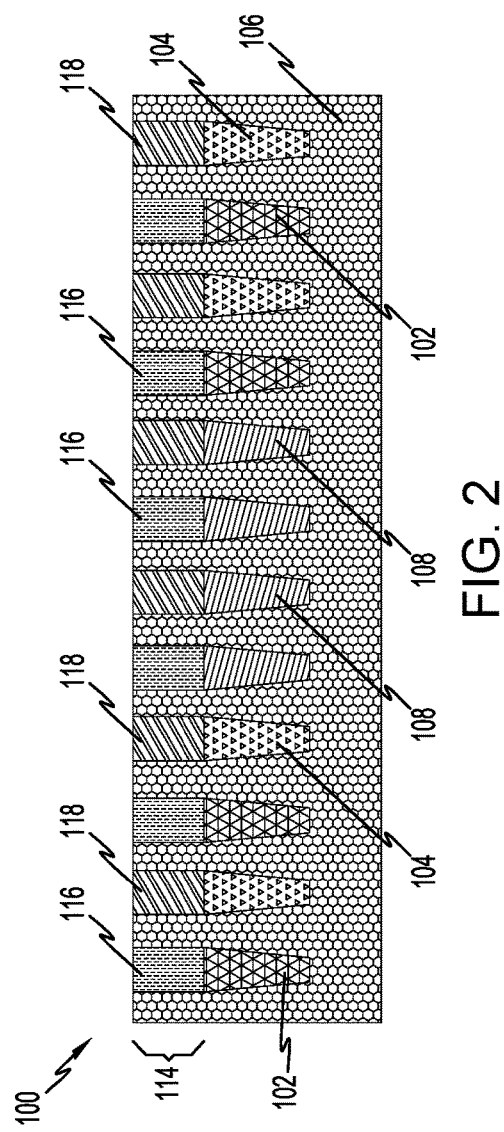

DIELECTRIC CAPS FOR POWER AND SIGNAL LINE ROUTING

BACKGROUND

The present disclosure relates generally to semiconductor integrated circuits, and more specifically, relates to power line and signal line routing in semiconductor integrated circuits.

Electrical power is delivered to components of an integrated circuit via a power grid. A power grid may have power lines or rails held at a source voltage potential (VDD) and at a ground voltage potential (VS S), respectively. Signal lines (also referred to as signal propagation lines) are routed relative to the power lines and in association with an interconnect structure to electrically connect and operate the components of a variety of functional cells of the integrated circuit.

As integrated circuit manufacturing technologies continue to evolve toward smaller design rules and higher integration densities, integrated circuit devices and components become increasingly smaller, creating challenges in layout formation and device optimization. For example, some integrated circuits require increased power to activate the cells, thus power lines or rails are generally made relatively wide to accommodate the power requirements and to minimize resistance for high performance. However, the presence of wide power lines increases potential for shorting, generates noise in the signal lines through capacitance coupling, and occupies cell space which may be otherwise used for additional signal lines.

SUMMARY

Embodiments provide techniques for improved power line and signal line routing in semiconductor integrated circuits.

In one illustrative embodiment, a semiconductor interconnect structure comprises a substrate, a plurality of metal lines disposed relative to the substrate and a plurality of first and second caps disposed on the metal lines wherein the first caps comprise a first dielectric material and the second caps comprise a second dielectric material different from the first dielectric material.

Advantageously, a discontinuous dielectric cap provided by an alternating cap arrangement of different materials enables selective etching, via formation (e.g., self-aligning via formation), and connection to underlying power lines, while minimizing the potential of overlap or shorting with adjacent signal lines and/or adjacent power lines.

In accordance with an additional illustrative embodiment, as may be combined with the preceding paragraphs, the plurality of metal lines comprises first lines including a first metal material and second lines including a second metal material different from the first metal material. Still further, the first and second lines may be disposed in alternating relation.

In accordance with another illustrative embodiment, as may be combined with the preceding paragraphs, the first and second lines are grouped to form a source region, a ground region and a signal region disposed between the source region and the ground region. Each of the source region, the ground region and the signal region comprises the first and second lines.

In accordance with yet another illustrative embodiment, as may be combined with the preceding paragraphs, a first via is coupled in parallel relation to adjacent first lines in the source region and a second via is coupled in parallel relation to adjacent second lines in the ground region. Advantageously, the coupling of these adjacent first and second lines, which may form pairs of power lines in each source region coupled by a via, maximizes power delivery and increases decoupling capacitance thereby reducing power supply noise and improving circuit reliability.

In a further illustrative embodiment, a semiconductor interconnect structure comprises a substrate, at least a pair of power regions located with respect to cell boundaries of the substrate with each of the power regions comprising first and second power lines arranged in alternating relation and wherein the first power lines comprise a first material and the second power lines comprise a second material different from the first material, and a signal region comprising a plurality of signal lines at least partially disposed between the pair of power regions. The signal lines comprise first and second signal lines arranged in alternating relation where the first signal lines comprise the first material and the second signal lines comprise the second material. First caps are disposed on at least one first power line of one power region of the pair of power regions and on at least one first signal line of the signal region with the first caps comprising a first dielectric material. Second caps are disposed on at least one second power line of another power region of the pair of power regions and on at least one second signal line of the signal region where the second caps comprise a second dielectric material different from the first dielectric material.

In accordance with an additional illustrative embodiment, as may be combined with the preceding paragraphs, the power regions disposed relative to the cell boundaries each include alternating first and second different power lines. Respective ones of the first and second power lines may be coupled or nested in parallel relation in the first and second power regions. This enables, for example, formation of power lines of minimum width while also addressing decoupling capacitance concerns. Advantageously, power and signal capabilities are cooperatively improved within the interconnect structure.

In accordance with another illustrative embodiment, as may be combined with the preceding paragraphs, a first via couples adjacent first power lines in parallel in the one power region of the pair of power regions with the adjacent first power lines being separated by a second power line having a second cap disposed thereon. The one power region may be arranged to provide a source voltage potential. In accordance with another illustrative feature, a second via couples adjacent second power lines in parallel in the other power region of the pair of power regions with the adjacent second lines being separated by a first power line having a first cap disposed thereon. The other power region may be arranged to provide a ground voltage potential. The first and second vias in association with the nested pairs of first and second lines enables formation of powered regions meeting power consumption requirements as well as exhibiting reduced resistance and increased decoupling capacitance.

In yet another illustrative embodiment, a semiconductor interconnect structure comprises a substrate, a plurality of first and second lines arranged in alternating relation relative to the substrate with the first lines comprising a first metal material and the second lines comprising a second metal material different from the first metal material, first and second cap segments respectively disposed on select ones of the first and second lines where the first cap segments each comprise a first dielectric material and the second cap segments each comprise a second dielectric material different from the first dielectric material, a first via in electrical parallel communication with adjacent first lines and a second via in electrical parallel communication with adjacent second electrical lines. The adjacent first lines coupled by the first via are arranged to provide a source voltage potential. The adjacent second lines coupled by the second via are arranged to provide a ground voltage potential. The first and second lines disposed between the adjacent first lines and the adjacent second lines are signal lines.

Other embodiments will be described in the following detailed description of exemplary embodiments, which is to be read in conjunction with the accompanying figures.

BRIEF DESCRIPTION OF THE DRAWINGS

FIG. 1 is a top plan view of an interconnect structure of an integrated circuit according to one or more illustrative embodiments of the present invention.

FIG. 2 is a side cross-sectional view of the interconnect structure of FIG. 1 according to one or more illustrative embodiments of the present invention.

DETAILED DESCRIPTION

Figure 3:
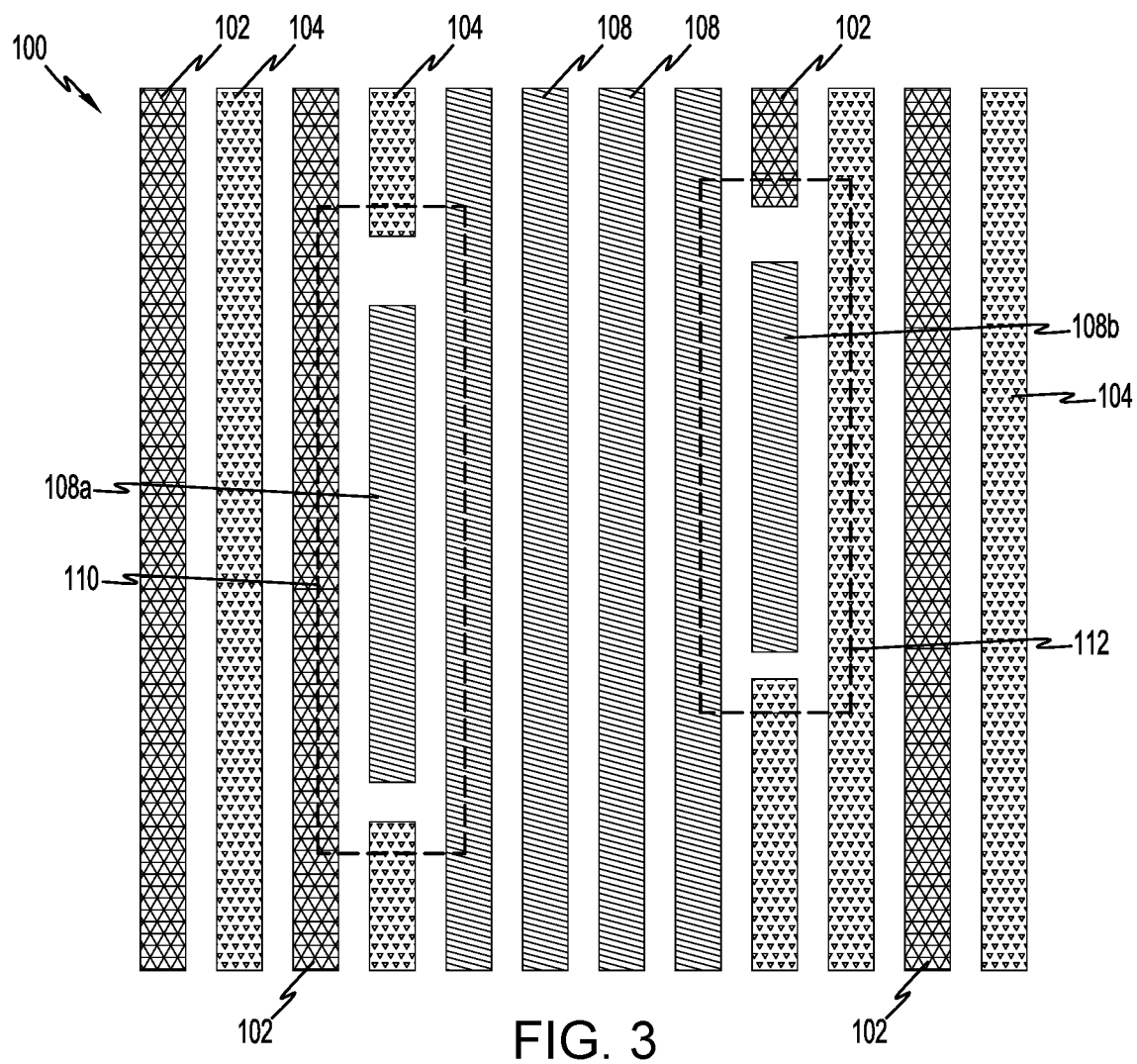
FIG. 3 is a top plan view of an interconnect structure of FIGS. 1 and 2 according to one or more illustrative embodiments of the present invention.

Illustrative embodiments of the disclosure will now be described with regard to methods for fabricating integrated circuits, as well as interconnect structures or cells used in integrated circuits. The integrated circuit fabrication methods described herein provide interconnect structures or cells having increased routing flexibility to maximize distribution of signal lines (also referred to herein as signal propagation lines) in regions of high concentration and multiple power rails coupled in parallel to increase decoupling capacitance thereby reducing power supply noise and improving circuit reliability. The integrated circuit fabrication methods also enable self-aligned via formation with underlying power rails and/or signal transmission signal lines of the interconnect structure.

The various layers, structures, and regions shown in the accompanying drawings are schematic illustrations that are not drawn to scale. In addition, for ease of explanation, one or more layers, structures, and regions of a type commonly used to form integrated circuits or semiconductor structures may not be explicitly shown in a given drawing. This does not imply that any layers, structures, and regions not explicitly shown are omitted from the actual interconnect structure. Furthermore, the embodiments discussed herein are not limited to the particular materials, features, and processing steps shown and described herein. In particular, with respect to integrated circuit (IC) processing steps, it is to be emphasized that the descriptions provided herein are not intended to encompass all of the processing steps that may be required to form a functional integrated circuit device. Rather, certain processing steps that are commonly used in forming semiconductor or integrated circuit devices, such as, e.g., wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the interconnect structure are not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of an integrated circuit according to illustrative embodiments utilize a variety of individually known physical and chemical processes performed on a semiconductor (e.g., silicon) substrate, some of which are described in the immediately following paragraphs.

In general, the various processes used to form an interconnect structure that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others. Removal/etching is any process that removes material from a substrate. Examples include etch processes (either wet or dry), and chemical-mechanical planarization (CMP), and the like. Semiconductor doping is the modification of electrical properties by doping, for example, transistor sources and drains, generally by diffusion and/or by ion implantation. Films of both conductors (e.g., poly-silicon, aluminum, copper, etc.) and insulators (e.g., various forms of silicon dioxide, silicon nitride, etc.) are used to connect and isolate transistors and their components. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the substrate is aligned to the previously formed patterns and slowly the conductors, insulators and selectively doped regions are built up to form the final device.

Integrated circuits (ICs) include, for example, transistors, resistors and capacitors, which are initially isolated, and subsequently interconnected using interconnect structures formed in multiple metallization layers or levels. Each interconnect structure may include one or more cells with a power grid having a power rack or line held at a source voltage potential (VDD) and a power rack or line held at a ground voltage potential (VSS), and a plurality of signal propagation lines disposed therebetween. The VDD power line and the VSS power line are disposed at the boundaries of the cell of the interconnect structure. A given cell performs one or more functions of the integrated circuit. An interconnect structure may include one or more cells which may be connected to adjacent cells to perform the intended function of the integrated circuit.

A conventional interconnect structure used in conventional integrated circuits (IC) circuits may, for example, include an interconnect metallization layer having at least one cell and be designed to provide one or more intended functions of the IC circuit. In an early stage of fabrication, the interconnect structure or, more specifically, a cell in the interconnect level, includes a dielectric base, a routing track disposed in the dielectric base and a dielectric cap extending continuously to cover the power grid and the dielectric base. The routing track includes a power grid having VDD and VSS power lines arranged at the boundaries of the cell of the interconnect structure. Signal tracks or signal propagation lines are disposed between the VDD and VSS power lines. The VDD and VSS power lines are typically wider than the signal propagation lines. Wider VDD and VSS power lines are used in power delivery to minimize resistance in the power delivery network. However, in certain IC designs, it is often desirable to pack as many signal propagation lines as possible in the interconnect structure, particularly, in a congested area or regions on the chip where an increased number of signal propagation lines is needed to perform the intended functions of the cell. This comes at the potential expense of degrading power line performance.

Referring now to FIGS. 1-3, illustrative embodiments overcome the above-mentioned and other drawbacks associated with conventional interconnect structures by, inter alia, replacing the individual VDD and VSS power lines of the power grids of the conventional interconnect structure with, in accordance with an illustrative embodiment of an interconnect structure 100, multiple alternating or nested VDD and VSS power lines 102, 104 at cell boundaries within a dielectric base 106 (e.g., shown in FIG. 2).

Furthermore, in accordance with an illustrative embodiment, the width of each of parallel VDD and VSS power lines 102, 104 is substantially reduced relative to VDD and VSS power lines of a conventional interconnect structure and, may, in some illustrative embodiments, generally approximate the width of signal propagation lines 108 disposed between the VDD and VSS power lines 102, 104. The VDD power lines 102 at one side of the cell boundary will be interconnected in parallel by an overlying first via (not shown) to form at least part of a first power region of the interconnect structure 100 and the VSS power lines 104 at the other side of the cell boundary will be connected in parallel by an overlying second via (not shown) to form at least part of a second power region of the interconnect structure 100. The signal propagation lines 108 form a signal region of the interconnect structure 100.

By connecting respective ones of the VDD power lines 102 and respective ones of the VSS power lines 104 in parallel via the respective first and second vias, the resistance can be recovered, i.e., as opposed to a large resistance incurred by a single individual VDD power line or a single individual VSS power line. In addition, this arrangement provides routing flexibility. For example, with reference to FIG. 3, in the event another signal propagation line 108 is needed in, for example, a congested area, one or both of the VDD and/or VSS power lines 102, 104 may be interrupted whereby the respective areas vacated or made available, depicted by hashed lines 110, 112, are used to emplace another signal propagation line 108a, 108b. This advantageously co-optimizes power and signal capabilities within the interconnect structure 100. In illustrative embodiments, the VDD power lines 102 and the VSS power lines 104 comprise different metal materials. In illustrative embodiments, the signal propagation lines 108 may comprises alternating lines having different materials.

With reference again to FIG. 2, the alternating parallel VDD power lines 102 and alternating VSS power lines 104 on respective boundary sides of the cell or interconnect structure 100 may be coupled to the respective first and second vias (not shown) through the use of a discontinuous dielectric cap structure 114 disposed on the VDD and VSS power lines 102, 104 and the signal propagation lines 108. In illustrative embodiments, the discontinuous dielectric cap structure 114 includes two different alternating cap segments (caps) 116, 118 comprised of different materials. The different materials of the alternating cap segments 116, 118 of the discontinuous dielectric cap structure 114 provide etch selectivity enabling etching of the first cap segments 116 down to the pair of VDD power lines 102 without etching the second cap segments 118 and/or etching the second cap segments 118 down to the pair of the VSS power lines 104 without etching the first cap segments 116. Thus, the VDD power lines 102 may be connected with the first via without connecting to, or shorting with, the middle intervening VSS power line 104 or with any of the signal propagation lines 108. Similarly, the VSS power lines 104 may be connected with the second via without connecting to, or shorting with, the middle intervening VDD power line 102 or with any of the signal propagation lines 108.

Figure 4:
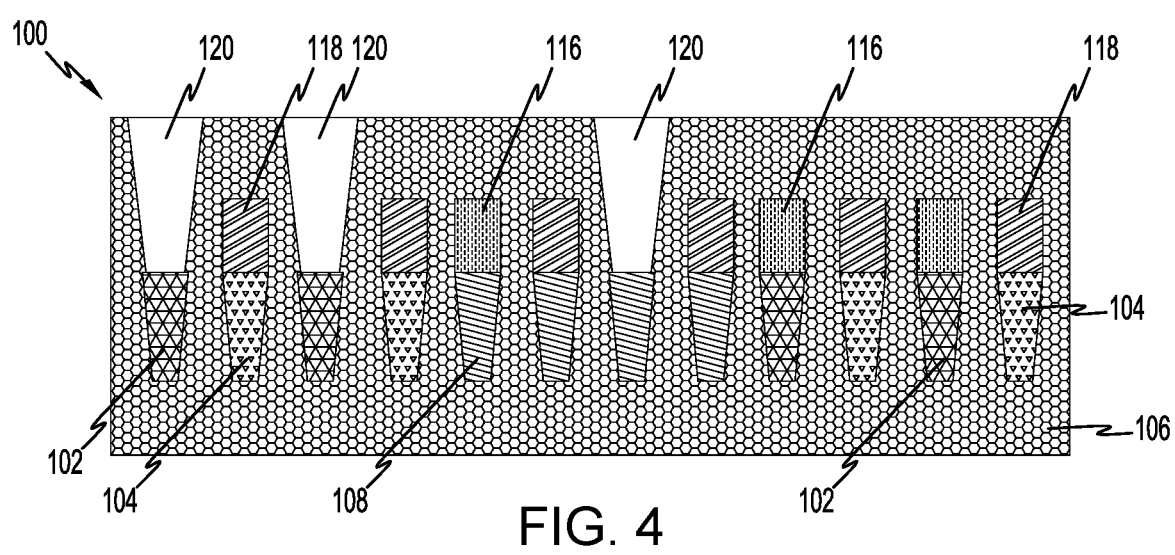
FIG. 4 is a side cross-sectional view of the interconnect structure of FIGS. 1-3 according to one or more illustrative embodiments of the present invention.

With reference to FIG. 4, as an additional advantage or feature, the use of the discontinuous dielectric cap structure 114 and alternating cap segments 116, 118 of different materials provides self-aligning capabilities in association with the one or more etching processes utilized in forming via openings 120 to the VDD power line 102, VSS power line 104 and/or a targeted signal propagation line 108. For example, two VDD power lines 102 may be connected to the same upper via segment through via openings 120, without shorting to the adjacent VSS power line(s) 104. For signal propagation lines 108, a single line can be contacted by a via above without shorting to adjacent signal propagation lines 108, even if the upper via segment is larger than the signal propagation lines 108 to which it is connected.

Figure 5B:
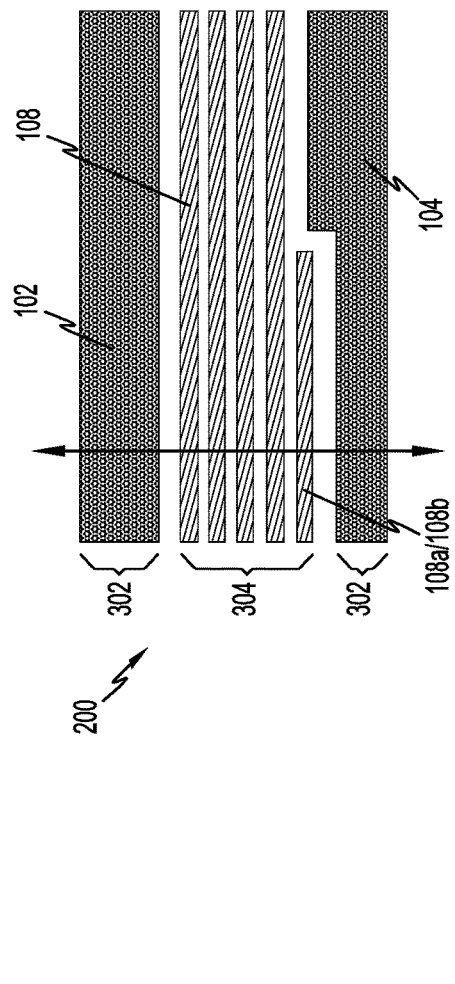
FIG. 5B is a plan view in cross-section of the interconnect structure at the first intermediate stage of fabrication according to one or more illustrative embodiments of the present invention.
Figure 5A:
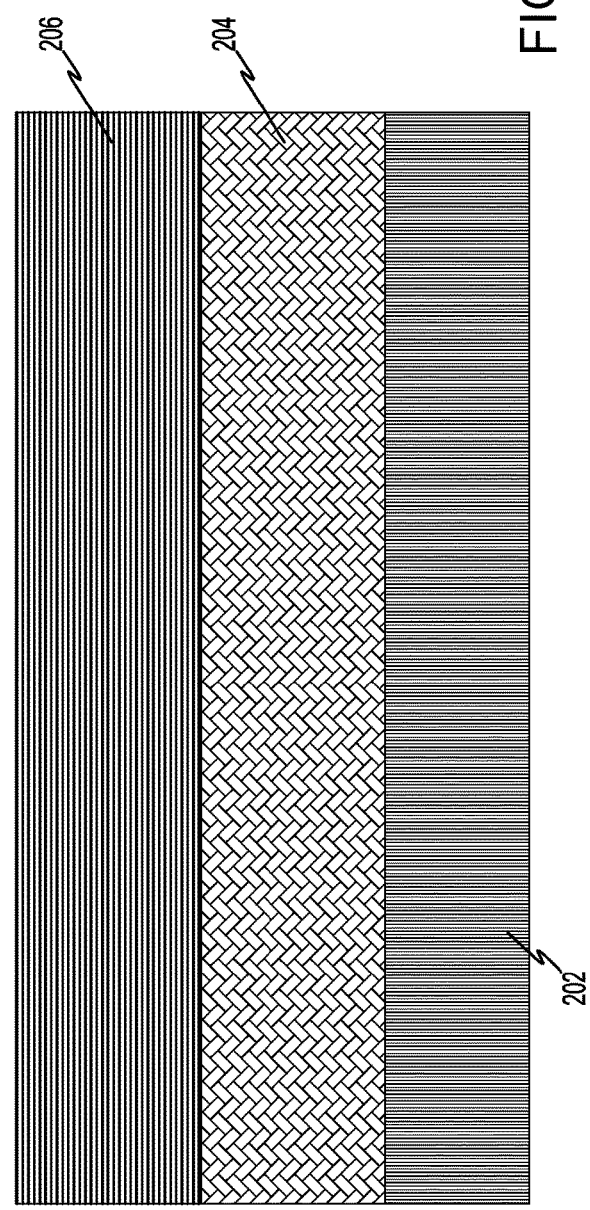
FIG. 5A is a side cross-sectional view of an interconnect structure at a first intermediate stage of fabrication according to one or more illustrative embodiments of the present invention.

Referring now to FIGS. 5A and 5B, one illustrative methodology for forming the interconnect structure 100 of the present disclosure will be discussed. FIG. 5A schematically illustrates a first intermediate stage of fabrication of an interconnect structure 200, which is subject to multiple semiconductor or IC manufacturing processes to form, for example, the interconnect structure 100 of FIGS. 1-4. The interconnect structure 200 will be incorporated as an interconnect level or cell component of an integrated circuit.

FIG. 5A is a schematic cross-sectional side view of an interconnect structure 200 at a first intermediate stage of fabrication comprising a substrate (e.g., a semiconductor wafer) 202, at least one FEOL (front-end-of-line) layer 204 and at least one MOL/BEOL (middle-of-line/back-end-of-line) layer 206. The FEOL layer 204 incorporates various semiconductor devices and components that are formed in or on the active surface of the substrate 202 to provide integrated circuitry for a target application. The substrate 202 may be a generic substrate layer, and may comprise one of different types of semiconductor substrate materials. For example, in one embodiment, the substrate 202 may include a bulk wafer that is formed of silicon (Si) or germanium (Ge), or other types of semiconductor wafer materials that are commonly used in bulk semiconductor fabrication processes such as a silicon-germanium alloy, compound semiconductor materials (e.g., III-V), etc. In another embodiment, the substrate 202 may be an active semiconductor layer of an SOI (silicon-on-insulator) material, GeOI (germanium-on-insulator) material, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL layer 204.

As noted above, the FEOL layer 204 of the interconnect structure 200 may comprise various semiconductor devices and components. For example, the FEOL layer 204 may comprise field-effect transistor (FET) devices (such as FinFET devices, vertical FET devices, planar FET devices, etc.), bipolar transistors, diodes, capacitors, inductors, resistors, isolation devices, etc., which are formed in or on the active surface of the semiconductor structure. In general, FEOL processes typically include preparing the substrate, forming isolation structures (e.g., shallow trench isolation), forming device wells, patterning gate structures, forming spacers, forming source/drain regions (e.g., via implantation), forming silicide contacts on the source/drain regions, forming stress liners, etc. The MOL/BEOL layer 206 includes various contacts or interconnects which eventually connect the components of the FEOL layer 204 with the remaining components of the interconnect structure 200 and the integrated circuit.

FIG. 5B is a schematic top plan view in cross-section of the interconnect structure 200 illustrating the respective locations of the power regions 302 incorporating the VDD and VSS power lines 102, 104 adjacent the cell boundary and the signal region 304 incorporating the signal propagation lines 108 and the signal propagation lines 108a or 108b.

Figure 6:
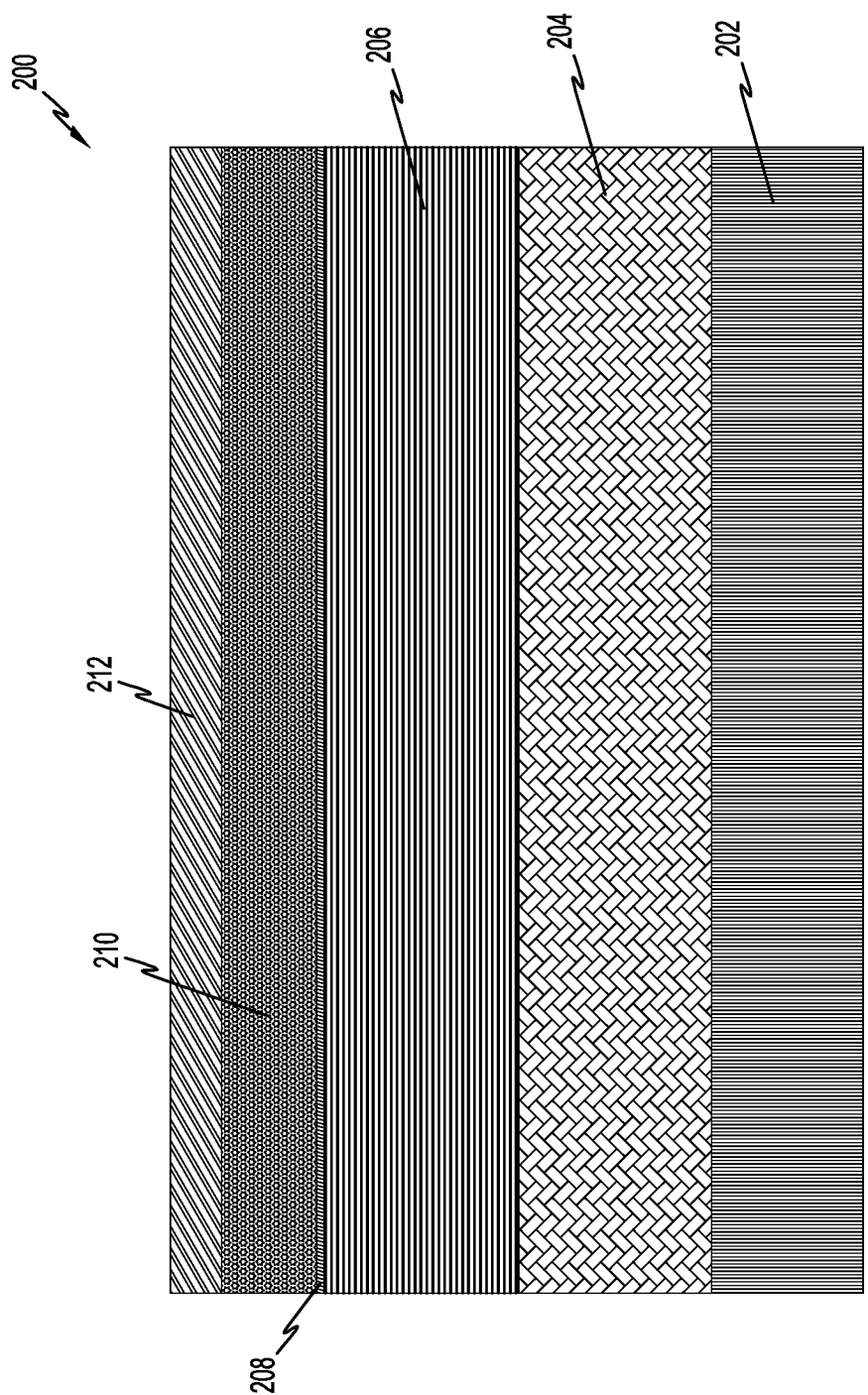
FIG. 6 is a side cross-sectional view of the interconnect structure at a second intermediate stage of fabrication according to one or more illustrative embodiments of the present invention.

FIG. 6 illustrates the interconnect structure 200 at a second intermediate stage of fabrication subsequent to deposition of a tantalum nitride (TaN) layer 208, a ruthenium (Ru) layer 210 and a hard mask layer 212 on top of the MOL/BEOL layer 206. The layers 208, 210, 212 may be deposited using known deposition and/or polishing techniques. The hard mask layer 212 comprises a high-k dielectric material and may include a semiconductor oxide, a semiconductor nitride, semiconductor oxynitride, or any high-k material having a dielectric constant greater than silicon oxide. Exemplative materials for the hard mask layer 212 may include, without limitation, titanium nitride (TiN) or silicon nitride (SiN).

Figure 7:
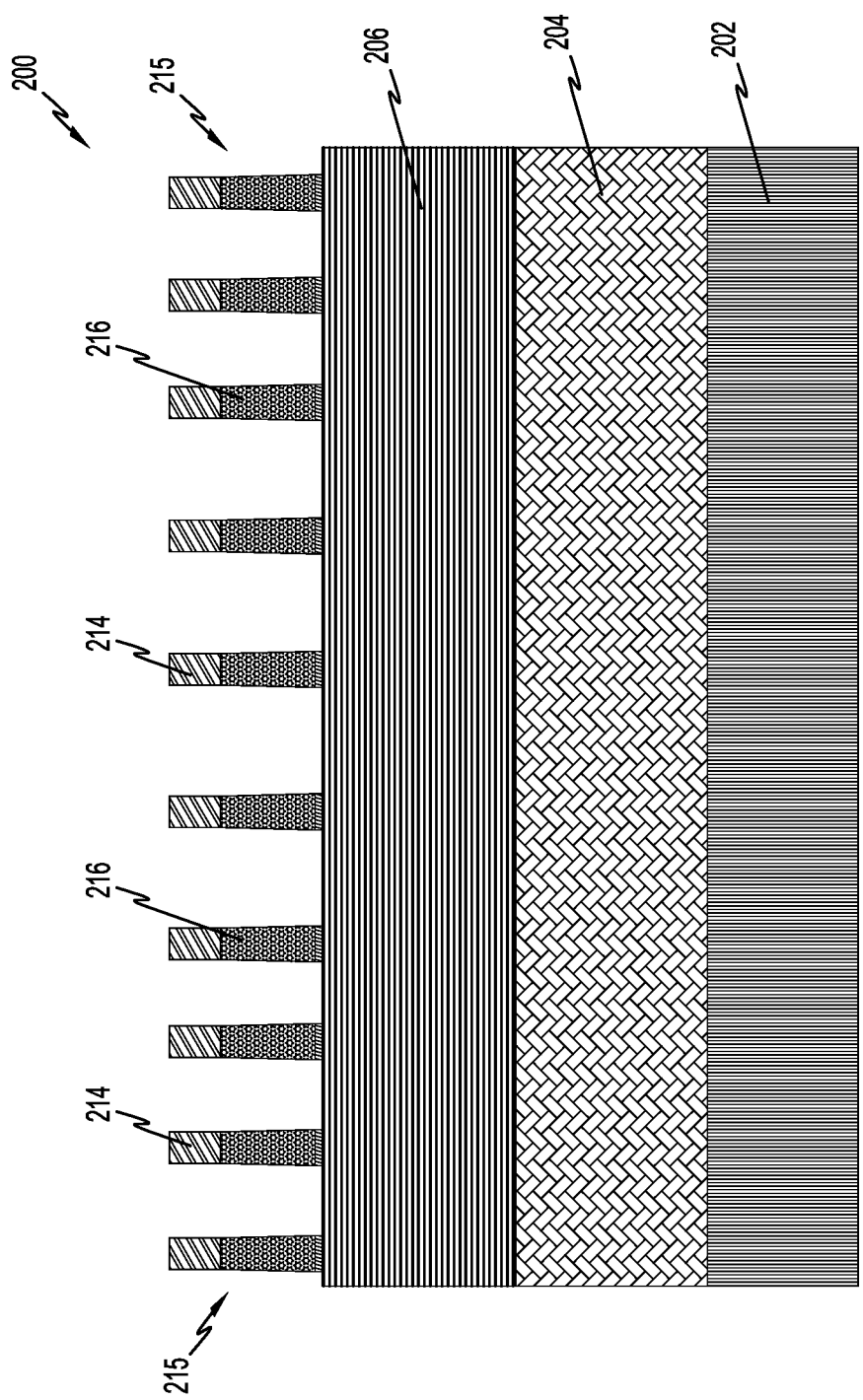
FIG. 7 is a side cross-sectional view of the interconnect structure at a third intermediate stage of fabrication according to one or more illustrative embodiments of the present invention.

FIG. 7 illustrates the interconnect structure 200 at a third intermediate stage of fabrication. Through one or more subtractive metal etch processes, including, for example, plasma etching, the tantalum nitride (TaN) layer 208, the ruthenium (Ru) layer 210 and the hard mask layer 212 are patterned to form a plurality of vertical spaced pillars 215. Patterning may be achieved through a double patterning lithographic etch (LELE) process, subtractive etching and/or a direct cut of the ruthenium (Ru) layer 210. The etched hard mask layer 212 forms first caps or first cap segments 214 corresponding to either of the first or second cap segments 116, 118 of the discontinuous dielectric cap structure 114 of the interconnect structure 100 of FIGS. 1-4. Beneath each first cap segment 214 is a first line 216 formed of ruthenium (Ru) metal. The first lines 216 will eventually form the VDD power lines 102 and at least some of the signal propagation lines 108 of the interconnect structure 100 of FIGS. 1-4. The first lines 216 may taper, i.e., increase in dimension or width toward the MOL/BEOL layer 206.

Figure 8:
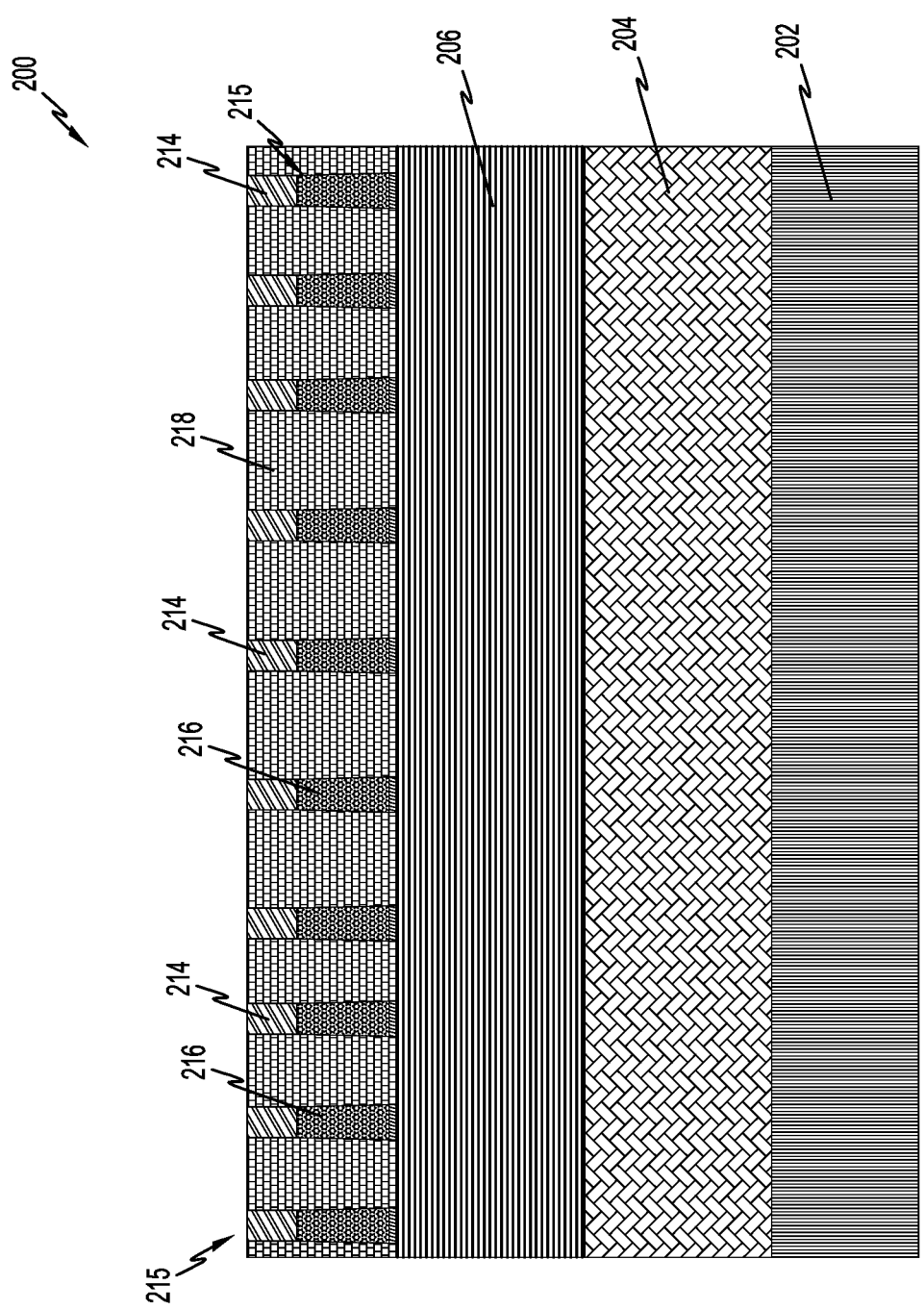
FIG. 8 is a side cross-sectional view of the interconnect structure at a fourth intermediate stage of fabrication according to one or more illustrative embodiments of the present invention.

FIG. 8 illustrates the interconnect structure 200 at a fourth intermediate stage of fabrication where a dielectric fill 218 is deposited on the vertical spaced pillars 215 to fill the voids therebetween. The dielectric fill 218 may include silicon oxide (e.g., $SiO_2$), silicon nitride (SiN), silanol (SiOH), hydrogenated silicon nitride (SiNH), silicon carbide (SiC), silicon carbon nitride (SiCN), hydrogenated silicon carbide (SiCH), fluorine-doped silicon oxide (SiOF) carbon doped oxide (CDO), SiOC films or SiOCH low-k films and other similar types of insulating/dielectric materials or porous dielectrics which are non-reactive with the metallic material that is used to form the second metallic line of the interconnect structure. The dielectric fill 218 may be formed using known deposition techniques, such as, for example, ALD (atomic layer deposition), CVD (chemical vapor deposition), PECVD (plasma-enhanced CVD), or PVD (physical vapor deposition), or spin-on deposition. A planarization process can be implemented using, for example, a chemical-mechanical polish (CMP) process with a suitable etch slurry to planarize any overburden of the dielectric fill.

Figure 9:
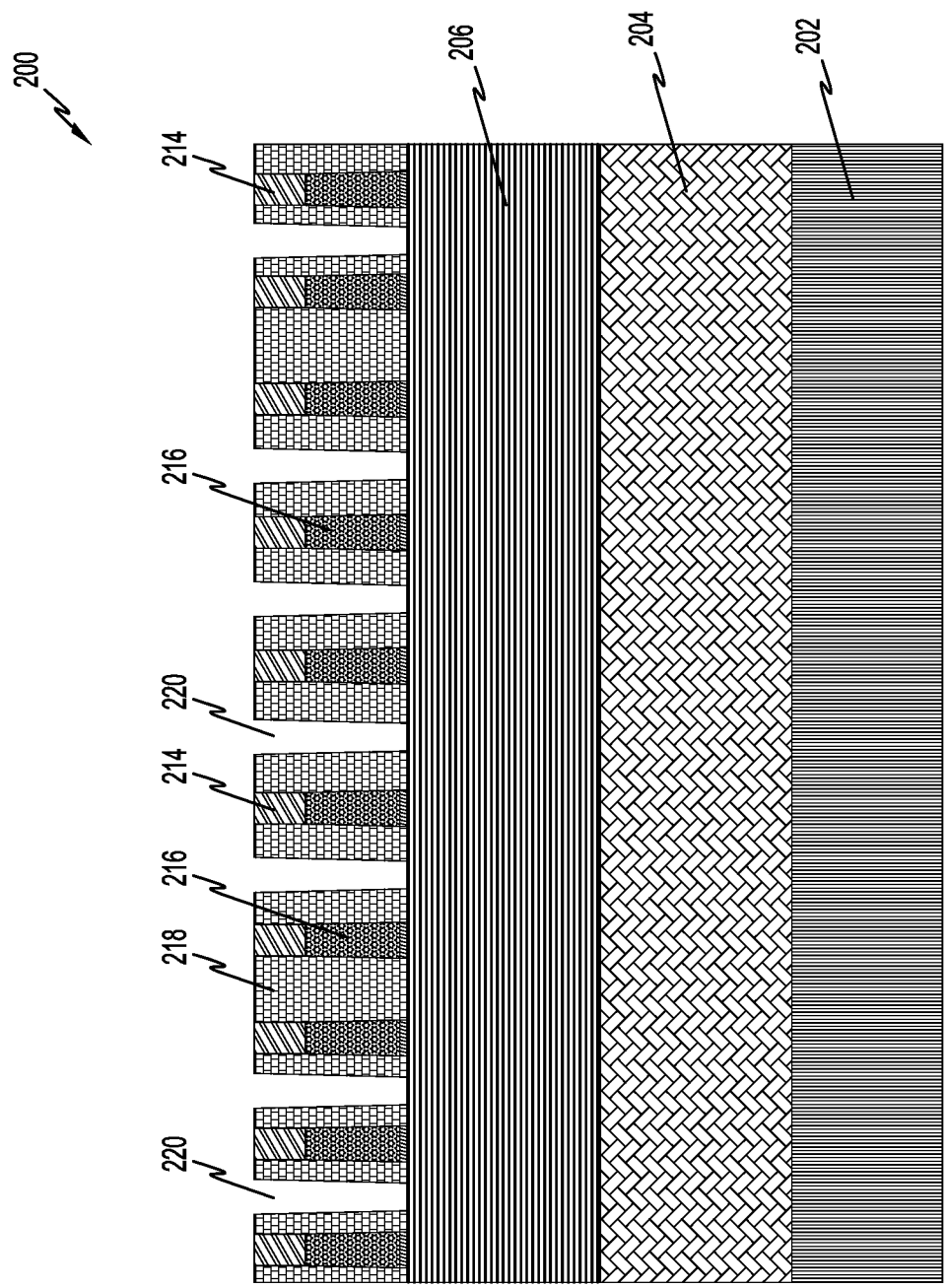
FIG. 9 is a side cross-sectional view of the interconnect structure at a fifth intermediate stage of fabrication according to one or more illustrative embodiments of the present invention.
Figure 10:
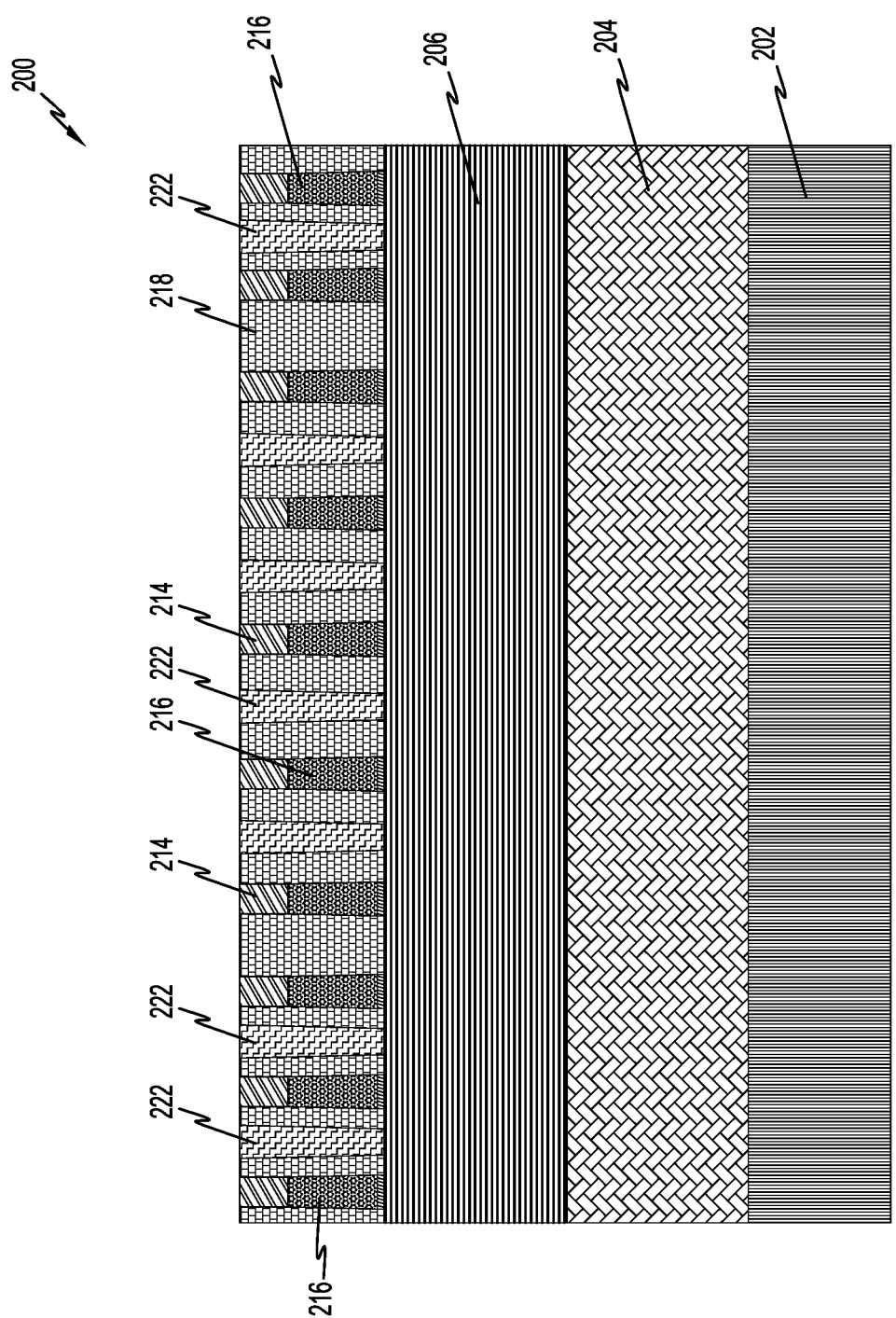
FIG. 10 is a side cross-sectional view of the interconnect structure at a sixth intermediate stage of fabrication according to one or more illustrative embodiments of the present invention.

FIG. 9 illustrates the interconnect structure 200 at a fifth intermediate stage of fabrication. Through one more lithographic and etching processes, the dielectric fill 218 is patterned and etched to form trenches 220 in the dielectric fill 218 extending to the MOL/BEOL layer 206. The trenches 220 may be generally tapered, reducing in width towards the MOL/BEOL layer 206. Referring now to FIG. 10, illustrating a sixth intermediate stage of fabrication of the interconnect structure 200, the trenches 220 are filled with metal, for example, copper, via a deposition process and subsequently planarized to form second lines 222, for example, tapered metal lines within the previously formed trenches 220. Known dry deposition techniques such as ALD, PVD or CVD or wet deposition techniques such as electroplating, and electroless plating, etc. may be used to deposit the ruthenium. The planarization process can be implemented using a chemical-mechanical polish (CMP) process with a suitable etch slurry. The second lines 222 will eventually form the VSS power lines 104 and at least some of the signal propagation lines 108 of the interconnect structure 100 of FIGS. 1-4.

Figure 11:
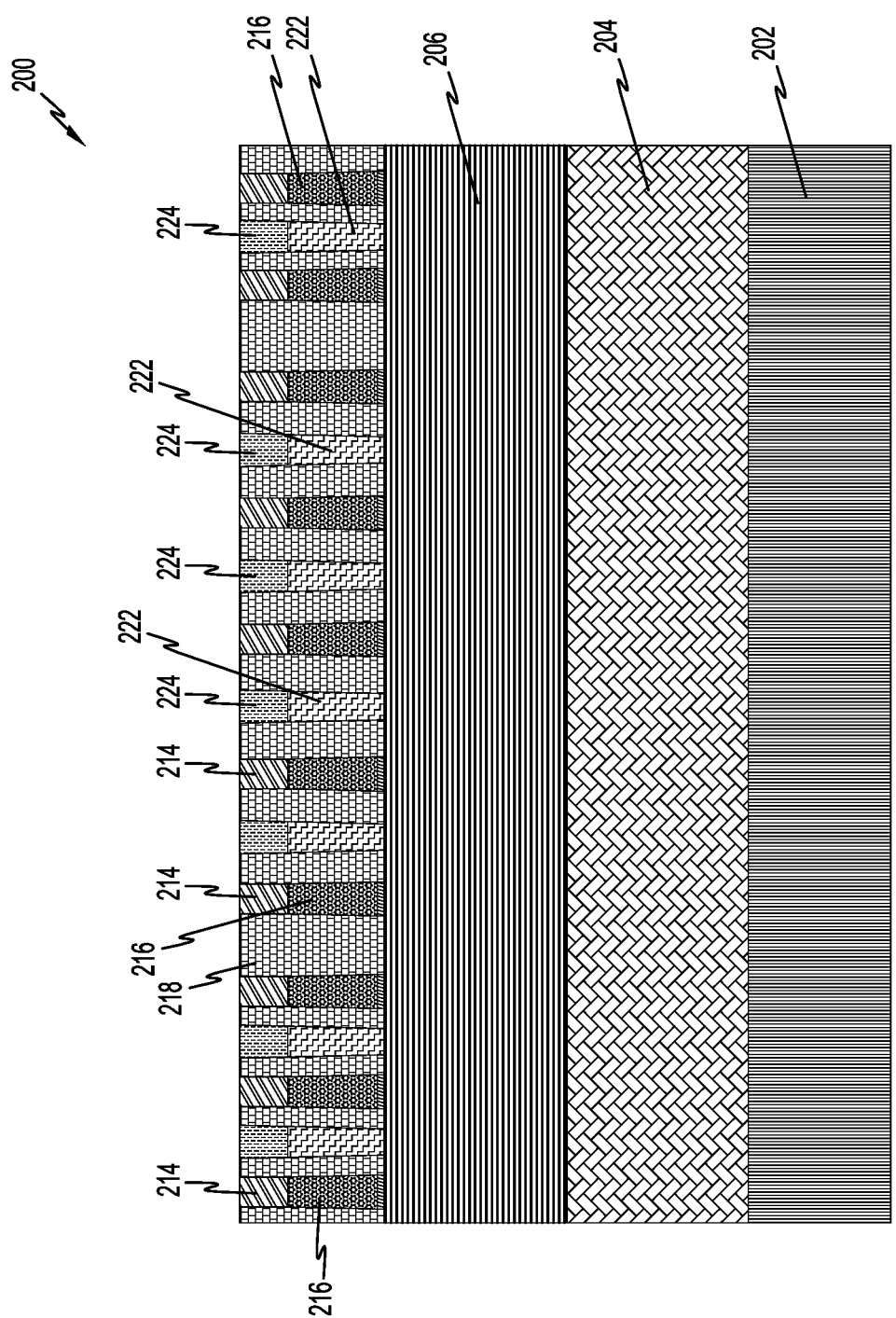
FIG. 11 is a side cross-sectional view of the interconnect structure at a seventh intermediate stage of fabrication according to one or more illustrative embodiments of the present invention.

With reference now to FIG. 11, illustrating a seventh intermediate stage of fabrication of the interconnect structure 200, the second lines 222 are recessed through one or more suitable etching and/or or removal processes, which in embodiments, is selective to the material of the hard mask layer 212 forming the first cap segments 214. Thereafter, a second hard mask layer is deposited into the recessed portions of the second lines 222. The second hard mask layer comprises a high-k dielectric material which is different from the hard mask layer 212 and the first cap segments 214. In illustrative embodiments, the second high-k dielectric material includes a semiconductor oxide, a semiconductor nitride, semiconductor oxynitride. The second hard mask layer may be subject to one or more polishing/removal processes to form second cap segments 224 over the second lines 222. The second cap segments 224 correspond to the second cap segments 118 of the discontinuous dielectric cap structure 114 of the interconnect structure 100 of FIGS. 1-4. Examples of suitable materials for the second hard mask layer include aluminum oxide ($AlO_x$), hafnium oxide ($HfO_x$), titanium oxide ($TiO_x$) and zirconium oxide ($ZrlO_x$). In other illustrative embodiments, the material for the first and second cap segments 214, 224 could be oxide based and nitride-based, respectively. For example, the first cap segments 214 may comprise aluminum oxide ($AlO_x$) or hafnium oxide ($HfO_x$) and the second cap segments 224 may comprise aluminum nitride (AlN) or silicon nitride (SiN). The first and second cap segments 214, 224 comprise materials having etch selectivity relative to each other.

Figure 12:
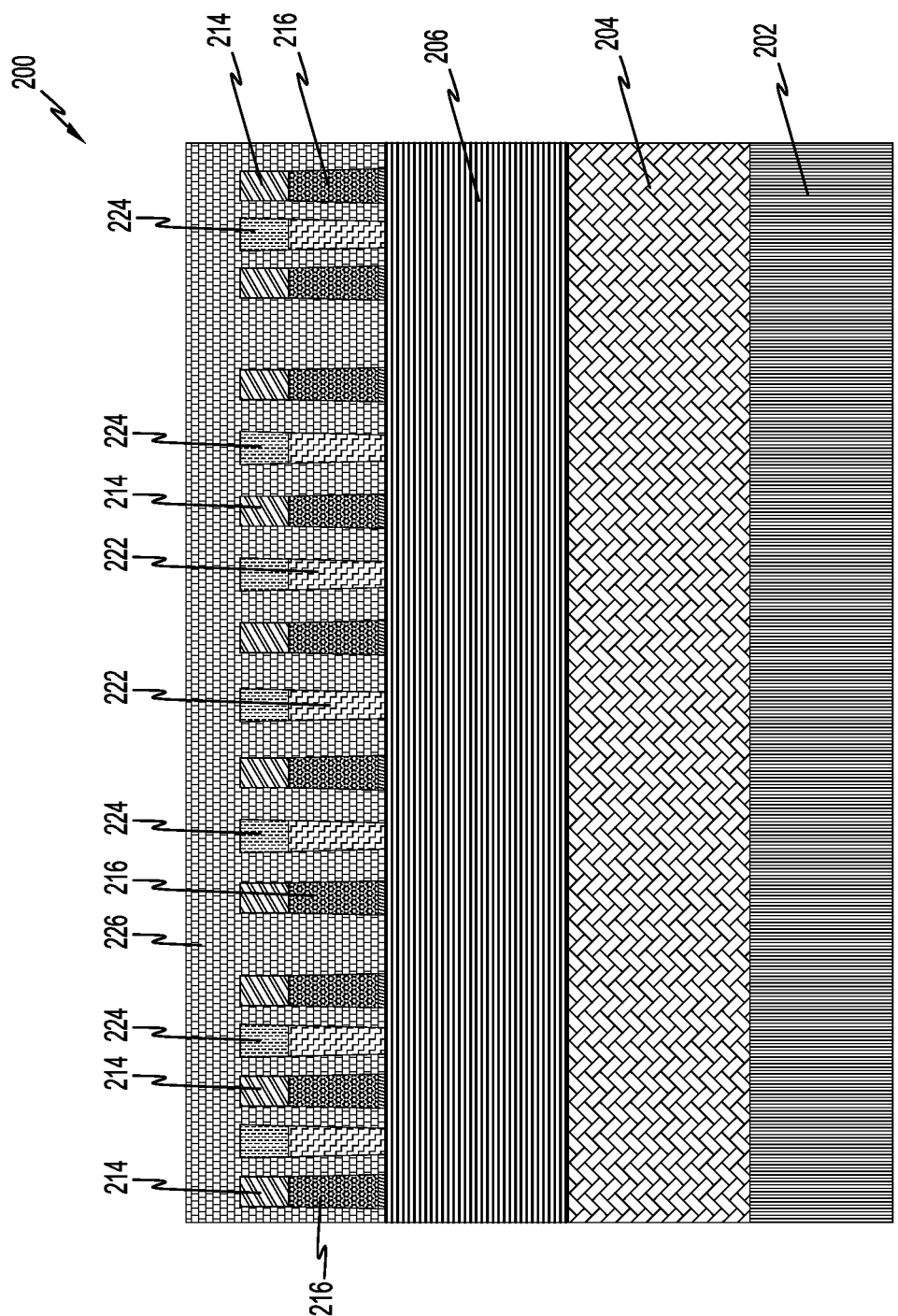
FIG. 12 is a side cross-sectional view of the interconnect structure at an eighth intermediate stage of fabrication according to one or more illustrative embodiments of the present invention.

With reference now to FIG. 12, illustrating an eight intermediate stage of fabrication, an interlayer dielectric 226 is deposited on the interconnect structure 200. The interlayer dielectric 226 may comprise an oxide material including but not limited to, silicon oxide, silicon nitride, silicon oxynitride, SiCO, SiCON, or any suitable combination of such materials. The oxide material or inter-layer dielectric (ILD) may be subjected to a chemical-mechanical polishing (CMP).

Figure 13:
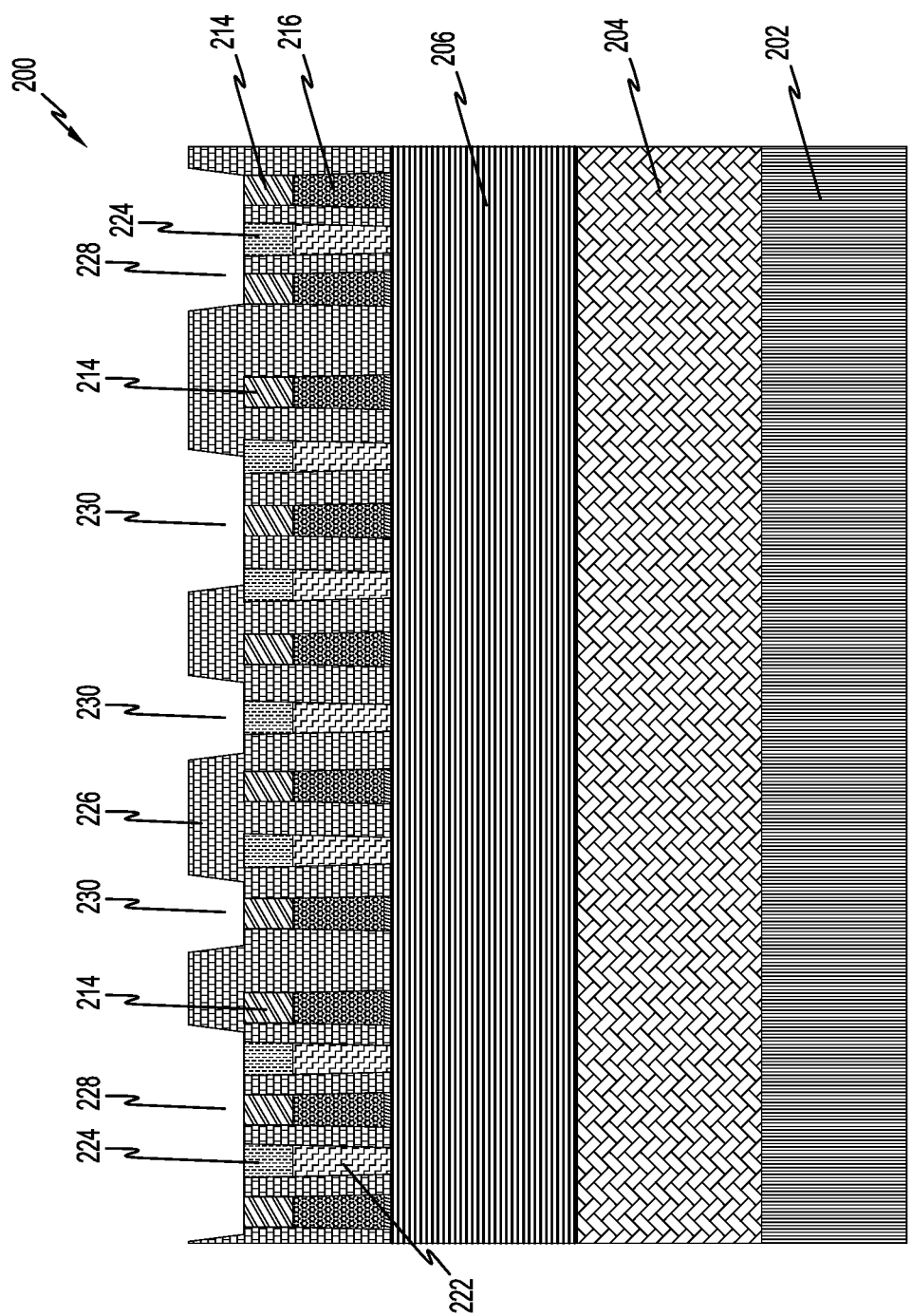
FIG. 13 is a side cross-sectional view of the interconnect structure at a ninth intermediate stage of fabrication according to one or more illustrative embodiments of the present invention.

Referring now to FIG. 13, illustrating a ninth intermediate stage of fabrication, a first step of via formation is performed by etching upper via openings 228, 230 in the interlayer dielectric 226. The upper via openings 228 are disposed along the periphery of the cell, i.e., above the areas of the cell which will form the power regions including the VDD and VSS power lines or rails. The upper via openings 230 are disposed above the interior of the cell, i.e., above the area of the cell forming the signal region including the signal propagation lines. Any suitable removal or etching process may be employed. The upper via openings 228, 230 extend to the first and second cap segments 214, 224 within the respective power and signal regions.

Figure 14:
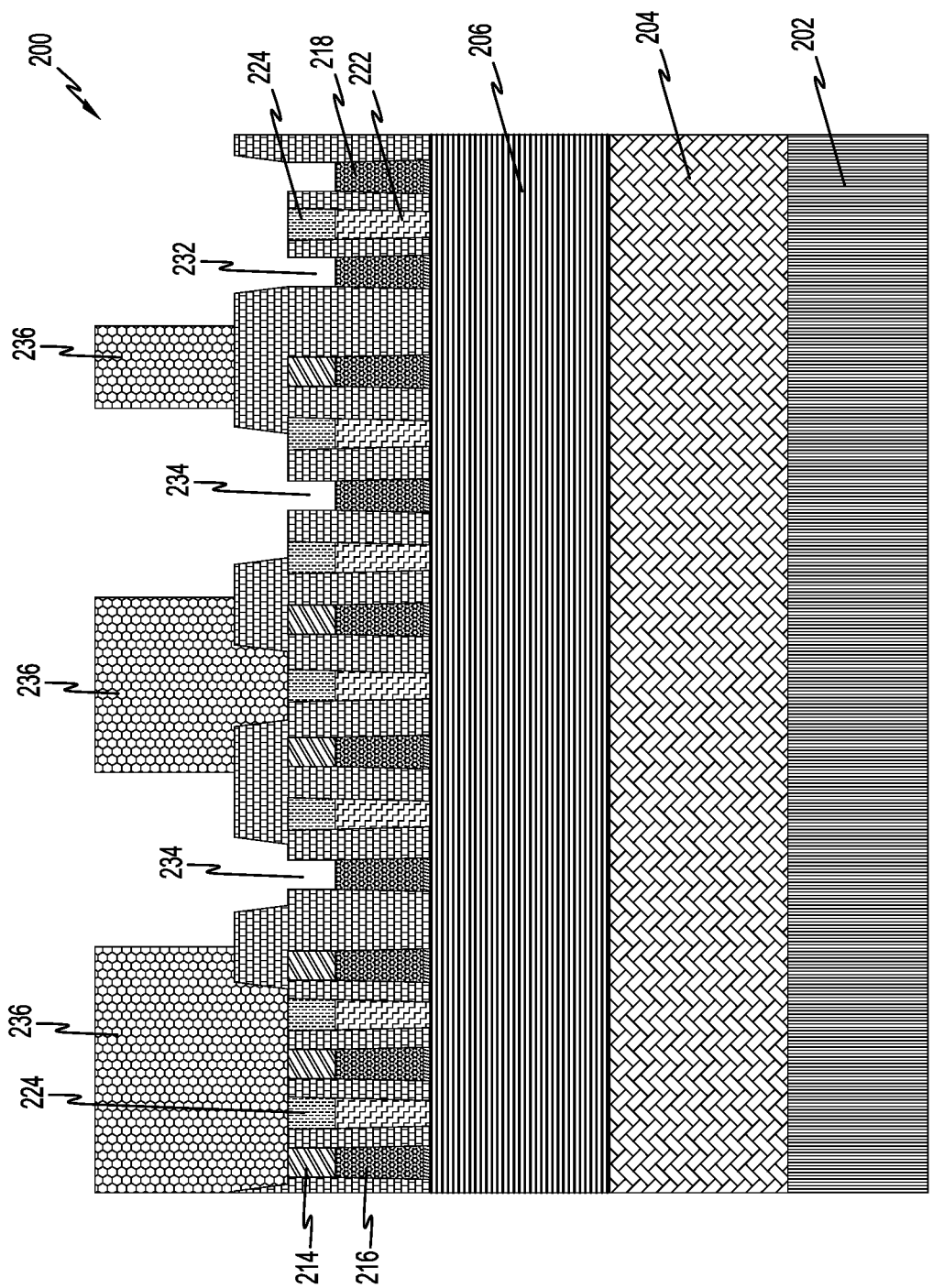
FIG. 14 is a side cross-sectional view of the interconnect structure at a tenth intermediate stage of fabrication according to one or more illustrative embodiments of the present invention.

With reference now to FIG. 14, a second step of via formation, associated with a tenth intermediate stage of fabrication, is performed to create lower via openings 232, 234 through removal of select first cap segments 214 within the power and signal regions, respectively. In one illustrative embodiment, a lithographic pattern is formed over the interconnect structure 200. The lithographic pattern may include forming a trilayer of organic planarizing layer (OPL) 236, silicon anti-reflective coating (not shown), and a photoresist (not shown) onto the interconnect structure 200, exposing the photoresist to a pattern of active radiation, and then developing the exposed photoresist with a resist developer to provide a patterned photoresist. At least one etch process selective to the material of the second cap segments 224 is employed to transfer the pattern from the patterned photoresist into the select first cap segments 214. The formed lower via openings 232 are in communication with select underlying first lines 216 which will form power lines or rails of the power region, e.g., power lines, in this exemplative embodiment, held at a source voltage potential (VDD). The lower via opening 234 are in communication with select underlying first lines 216 in the signal region forming some of the underlying signal propagation lines. The lower via openings 232, 234 define widths less than respective widths of their aligned upper via openings 228, 230. (FIG. 13). The OPL 236 may be removed through a suitable chemical etch process.

Figure 15:
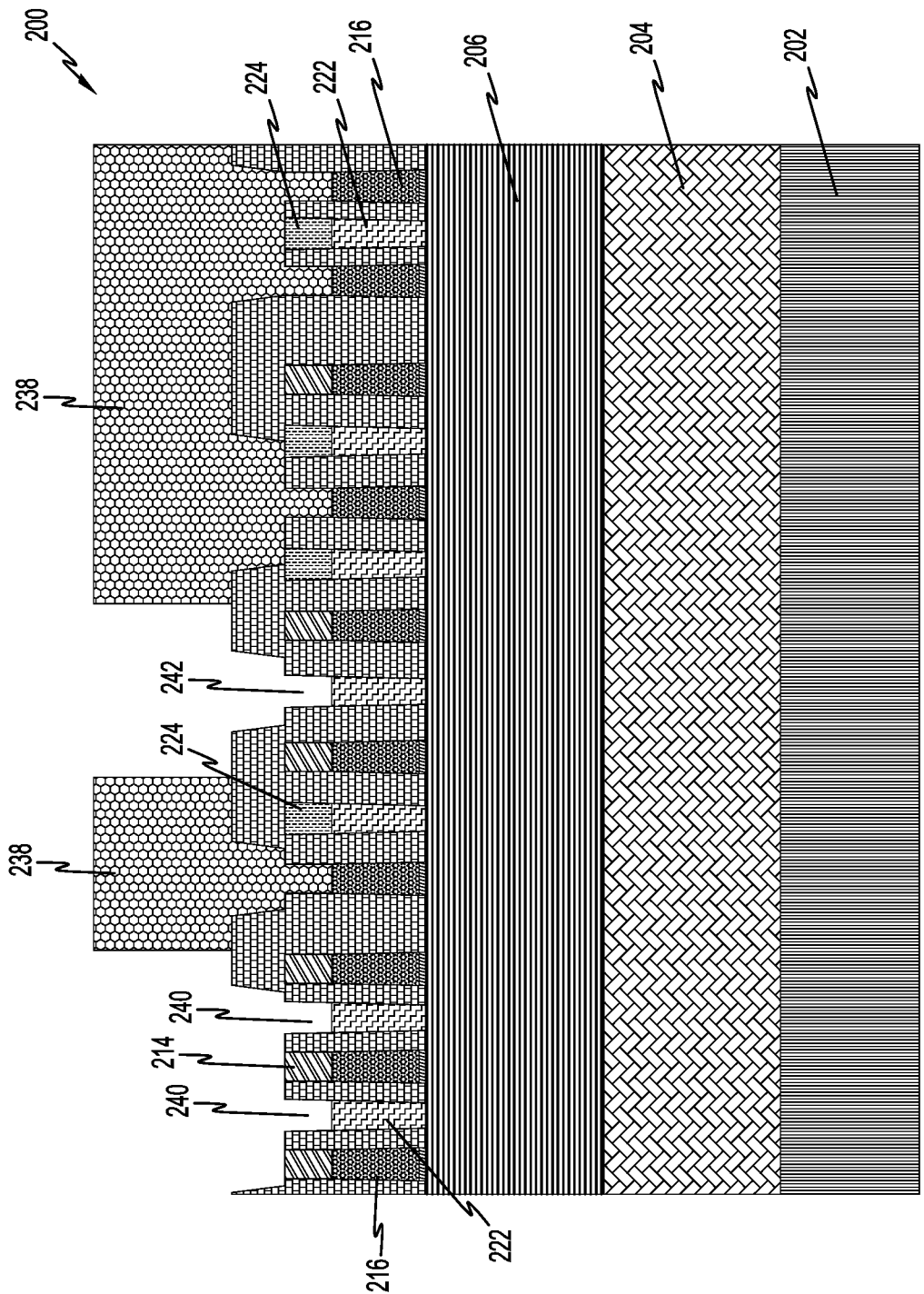
FIG. 15 is a side cross-sectional view of the interconnect structure at an eleventh intermediate stage of fabrication according to one or more illustrative embodiments of the present invention.

Referring now to FIG. 15 illustrating an eleventh intermediate stage of fabrication of the interconnect structure 200, the second step of formation of lower vias is continued through removal of select second cap segments 224 within the power and signal regions. A lithographic pattern includes a trilayer of organic planarizing layer (OPL) 238, silicon anti-reflective coating (not shown), and a photoresist (not shown) disposed on the interconnect structure 200. A pattern is developed into the photoresist and through one or more etching processes selective to the material of the first cap segments 214, lower via openings 240, 242 are formed in communication with select underlying second lines 222 in the power region, e.g., in this exemplative embodiment, power lines held at a ground voltage potential (VSS), and at least one select underlying second line 222 in the signal region, e.g., a signal propagation line. The lower via openings 240, 242 define via widths less than respective widths of their aligned upper via openings 228, 230 (FIG. 13). The OPL layer may be removed through a suitable chemical etch process.

Figure 16:
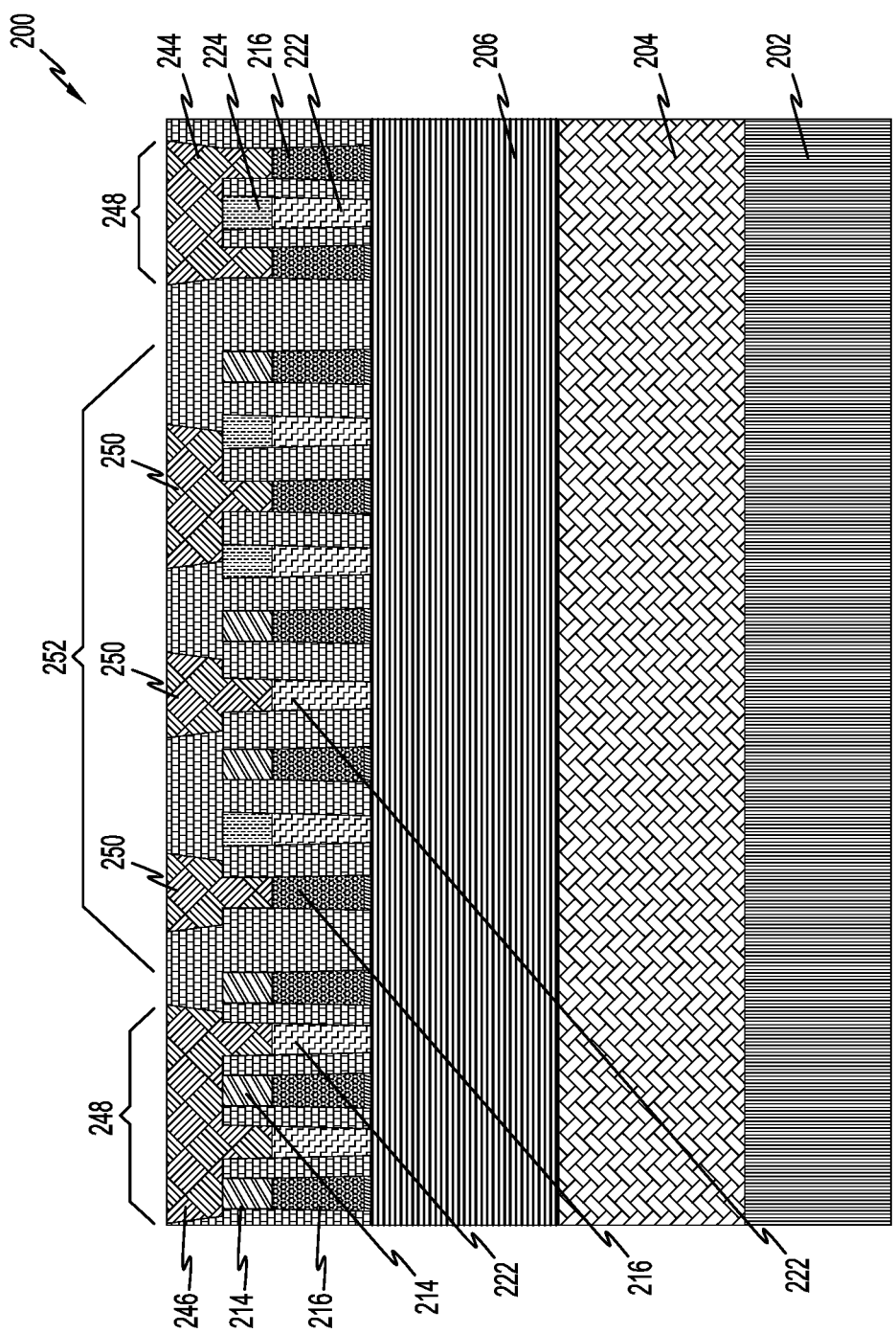
FIG. 16 is a side cross-sectional view of the interconnect structure at a twelfth intermediate stage of fabrication according to one or more illustrative embodiments of the present invention.

Referring now to FIG. 16 illustrating a twelfth intermediate stage of fabrication of the interconnect structure 200, a conductive metal is deposited onto the interconnect structure 200 to fill the upper via openings 228, 230 and the lower via openings 232, 234, 240, 242 using any suitable wet or dry deposition method. The metal selected for this metallization procedure may include cobalt, titanium, copper, aluminum (Al), tungsten (W), iridium (Ir), ruthenium (Ru), or alloys thereof. Deposition processes contemplated include CVD (chemical vapor deposition), sputtering, electrochemical deposition or like processes. An overburden of metal may be removed through an electropolishing process. Thus, at the twelfth intermediate stage of fabrication illustrated in FIG. 16, a first via 244 is formed in a first power region coupling, in parallel, adjacent first lines 216 to form a source voltage potential (VDD) region and a second via 246 is formed in a second power region coupling, in parallel, adjacent first lines 216 to form a ground voltage potential (VSS) region. The power regions or power grids 248 comprise alternating first and second lines 216, 222, i.e., alternating VDD and VSS power lines, respectively. The VDD power lines (first lines 216) and the VSS power lines (second lines 222) comprise ruthenium (Ru) and copper (Cu) respectively although other materials are also contemplated. It is also envisioned that the first via 244 and the second via 246 can be switched and coupled to the second lines 222 and the first lines 216, respectively. The presence of the second cap segment 224 over the second line 222 (i.e., a VSS line) in the source region electrically isolates the VSS line from the first via 244 and the other first lines 216 (e.g., VDD lines) in this region. Similarly, the presence of the first cap segments 214 over the first lines 216 (i.e., the VDD lines) in the ground region electrically isolates the VDD lines from the second via 246 and the other second lines 222 (e.g., VSS lines) in this region.

In addition, through the metallization process one or more third vias 250 are formed in the signal region 252, comprising the signal propagation lines, in communication with select ones of the first and second lines 216, 222. The one or more third vias 250 are electrically isolated, in part to the adjacent lines via the first and second cap segments 214, 224. The signal region 252 comprises alternating first and second lines 216, 222 functioning as signal propagation lines.

Thus, the interconnect structure 200 includes dense power grids having alternating first (VDD) and second (VSS) power lines or grids 216, 222 with relatively narrow widths whereby adjacent select lines 216, 222 are coupled in parallel through a via connection. By arranging the VDD and VSS next to one another, the decoupling capacitance is increased, which decreases power supply noise. The provision of the first and second cap segments 214, 224 minimizes line-to-line spacing resulting in additional increases in decoupling capacitance. The signal propagation lines also include alternating first and second lines 216, 222. The discontinuous dielectric cap disposed on the first and second lines 216, 222 including the VDD and VSS power lines and the signal propagation lines facilitates processing of the interconnect structure through selective etching, reduces potential for shorting with neighboring lines and enables self-alignment of the vias with the respective underlying first and second lines 216, 222. Also, in the event an additional signal propagation line is required, one or more of the VDD and VSS lines may be discontinuous whereby the vacated segment is replaced with a signal propagation line thereby enhancing flexibility of the interconnect structure to achieve various intended goals of the circuit as discussed hereinabove.

Following formation of the interconnect structure, additional layers or interconnect structures may be formed on the interconnect structure 200 to form an integrated circuit or semiconductor device.

It is to be understood that the methods discussed herein for an interconnect structure can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present disclosure can be employed in applications, hardware, and/or electronic systems. Suitable hardware and systems for implementing the disclosure may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the disclosure provided herein, one of ordinary skill in the art will be able to contemplate other implementations and applications of the techniques of the disclosure.

Although exemplary embodiments have been described herein with reference to the accompanying figures, it is to be understood that the disclosure is not limited to those precise embodiments, and that various other changes and modifications may be made therein by one skilled in the art without departing from the scope of the appended claims.

What is claimed is:

1. A semiconductor interconnect structure, comprising:
a plurality of first metal lines and a plurality of second metal lines disposed vertically adjacent each other relative to a substrate; and
a plurality of first and second caps disposed on the respective plurality of first metal lines and the plurality of second metal lines, the first caps comprising a first dielectric material and the second caps comprising a second dielectric material different from the first dielectric material.

2. The semiconductor interconnect structure according to claim 1, wherein the first and second caps are disposed in alternating relation on the respective plurality of first metal lines and the plurality of second metal lines.

3. The semiconductor interconnect structure according to claim 2, wherein the plurality of first metal lines comprises a first metal material and wherein the plurality of second metal lines comprises a second metal material different from the first metal material.

4. The semiconductor interconnect structure according to claim 3, wherein the plurality of first metal lines and the plurality of second metal lines are disposed in alternating relation.

5. The semiconductor interconnect structure according to claim 4, wherein the first caps are disposed on at least some of the plurality of first metal lines and the second caps are disposed on at least some of the plurality of second metal lines.

6. The semiconductor interconnect structure according to claim 5, wherein the plurality of first metal lines and the plurality of second metal lines are grouped to form a source region, a ground region and a signal region disposed between the source region and the ground region, each of the source region, the ground region and the signal region comprising the plurality of first metal lines and the plurality of second metal lines.

7. The semiconductor interconnect structure according to claim 6, further comprising a first via coupled in parallel to adjacent first metal lines of the plurality of first metal lines in the source region and a second via coupled in parallel to adjacent second metal lines of the plurality of second metal lines in the ground region.

8. A semiconductor interconnect structure, comprising:
at least a pair of power regions located with respect to cell boundaries of a substrate, each of the power regions comprising first power lines and second power lines arranged in alternating relation and vertically adjacent each other, the first power lines comprising a first material and the second power lines comprising a second material different from the first material;
a signal region disposed vertically adjacent to the pair of power regions relative to the substrate, comprising a plurality of signal lines at least partially disposed between the pair of power regions, the signal lines comprising first and second signal lines arranged in alternating relation, the first signal lines comprising the first material and the second signal lines comprising the second material;
first caps disposed on at least one first power line of one power region of the pair of power regions and on at least one first signal line of the signal region, the first caps comprising a first dielectric material; and
second caps disposed on at least one second power line of another power region of the pair of power regions and on at least one second signal line of the signal region, the second caps comprising a second dielectric material different from the first dielectric material.

9. The semiconductor interconnect structure according to claim 8, further comprising a first via coupling adjacent first power lines in parallel in the one power region of the pair of power regions with the adjacent first power lines being separated by a second power line of the second power lines having a second cap of the second caps disposed thereon.

10. The semiconductor interconnect structure according to claim 9, wherein the one power region is arranged to provide a source voltage potential.

11. The semiconductor interconnect structure according to claim 10, further comprising a second via coupling adjacent second power lines in parallel in the other power region of the pair of power regions with the adjacent second power lines being separated by a first power line of the first power lines having a first cap of the first caps disposed thereon.

12. The semiconductor interconnect structure according to claim 11, wherein the other power region is arranged to provide a ground voltage potential.

13. The semiconductor interconnect structure according to claim 12, further comprising at least a third via in communication with select ones of the first and second signal lines.

14. The semiconductor interconnect structure according to claim 13, wherein each of the first, second, and third vias define an upper via portion having a width greater than a lower via portion.

15. The semiconductor interconnect structure according to claim 8, wherein at least one of the first power lines and the second power lines is a discontinuous power line, and further including a signal line disposed in alignment with the discontinuous power line.

16. A semiconductor interconnect structure, comprising:
a plurality of first and second lines arranged in alternating relation and disposed vertically adjacent to each other relative to a substrate, the first lines comprising a first metal material and the second lines comprising a second metal material different from the first metal material;
first and second cap segments respectively disposed on select ones of the first and second lines, the first cap segments each comprising a first dielectric material and the second cap segments each comprising a second dielectric material different from the first dielectric material;
a first via in electrical parallel communication with adjacent first lines; and
a second via in electrical parallel communication with adjacent second lines;
wherein:
the adjacent first lines coupled by the first via are arranged to provide a source voltage potential;
the adjacent second lines coupled by the second via are arranged to provide a ground voltage potential; and
the first and second lines disposed between the adjacent first lines and the adjacent second lines are signal lines.

17. The semiconductor interconnect structure according to claim 16, further comprising at least a third via in electrical connection with select ones of the signal lines.

18. The semiconductor interconnect structure according to claim 17, wherein each of the first, second, and third vias define an upper via portion having a width greater than a lower via portion.

19. The semiconductor interconnect structure according to claim 16, wherein the first metal material comprises one of ruthenium and copper and the second metal material comprises the other of ruthenium and copper.

20. The semiconductor interconnect structure according to claim 16, wherein the first dielectric material comprises one of an oxide dielectric material and a nitride dielectric material and the second dielectric material comprises the other of the oxide dielectric material and the nitride dielectric material.

* * * * *